(12) United States Patent
McMorran

(10) Patent No.: US 8,680,488 B2
(45) Date of Patent: Mar. 25, 2014

(54) SYSTEM AND METHOD FOR PRODUCING AND USING MULTIPLE ELECTRON BEAMS WITH QUANTIZED ORBITAL ANGULAR MOMENTUM IN AN ELECTRON MICROSCOPE

(76) Inventor: Benjamin McMorran, Gaithersburg, MD (US)

( * ) Notice: Subject to any disclaimer, the term of this patent is extended or adjusted under 35 U.S.C. 154(b) by 80 days.

(21) Appl. No.: 13/372,914

(22) Filed: Feb. 14, 2012

(65) Prior Publication Data

US 2012/0153144 A1    Jun. 21, 2012

(51) Int. Cl.
    G02B 27/42    (2006.01)
(52) U.S. Cl.
    USPC .................. 250/492.2; 250/307; 250/311
(58) Field of Classification Search
    USPC .................................................. 250/492.3
    See application file for complete search history.

(56) References Cited

U.S. PATENT DOCUMENTS

| | | | |
|---|---|---|---|
| 5,838,468 A * | 11/1998 | Manako et al. | 359/15 |
| 7,701,381 B2 * | 4/2010 | Schmitt et al. | 342/42 |
| 2011/0133084 A1 * | 6/2011 | Nagaoki et al. | 250/311 |

OTHER PUBLICATIONS

Benjamin J. McMorran et al., Electron Vortex Beams with High Quanta of Orbital Angular Momentum, Science 331, 192 (2011).*
McMorran et al, "Electron Vortex Beams with High Quanta of Orbital Angular Momentum", Science 331, 192 (2011).*
N. R. Heckenbert, R. McDuff, C. P. Smith, and A. G. White,"Generation of optical phase singularities by computer-generated holograms," Opt. Lett. 17 (3), 221-223 (1992).*
Verbeeck et al, "Production and application of electron vortex beams", Nature vol. 467, 16, 301-304 Sep. 2010.*
M. Uchida, A. Tonomura, "Generation of electron beams carrying orbital angular momentum," Nature 464, 737 (2010).
K. Bliokh, Y. Bliokh, S. Savel'ev, F. Nori, "Semiclassical dynamics of electron wave packet states with phase vortices"; Phys. Rev. Lett. 99, 190404 (2007).
Brand, "Phase singularities in beams," Am. J. Phys. 67, 55 (1999).
G. Molina_Terriza, J. P. Torres, L. Torner, "Twisted photons," Nature Physics 3, 305 (2007).
S. Franke-Arnold, L. Allen, M. Padgett, "Advances in optical angular momentum," Laser Photon Rev. 2, 299 (2008).
J. Verbeeck, H. Tian, P. Schattschneider, "Production and application of electron vortex beams," Nature 467, 301 (2010).
Presentation, Lawrence Berkeley Lab, National Center for Electron Microscopy, Berkeley, CA, Feb. 15, 2011.
Presentation, University of Oregon, Department of Physics, Eugene, OR, Feb. 17, 2011.

(Continued)

Primary Examiner — Phillip A Johnston
(74) Attorney, Agent, or Firm — Daphne L. Burton; Burton IP Law Group

(57) ABSTRACT

A system and method for using electron beams with engineered phase dislocations as scanned probes in electron probe beam instruments such as scanning transmission electron microscopes. These types of electron beams have unique properties and can provide better information about a specimen than conventional electron beams. Phase dislocations may be created based on a pattern disposed on a nanoscale hologram, which may be placed in the electron optical column of the electron probe beam instrument. When an electron beam from the instrument is directed onto the hologram, phase dislocations may be imprinted onto the electron beam when electrons are diffracted from these holograms. For example, electron probe beams with spiral phase dislocations may occur. These spiral phase dislocations are formed using a hologram with a fork-patterned grating. Spiral phase dislocations may be used to provide magnetic contrast images of a specimen.

28 Claims, 9 Drawing Sheets

(56) References Cited

OTHER PUBLICATIONS

Presentation, Northern Arizona University, Department of Physics, Flagstaff, AZ, Mar. 1, 2011.
Presentation, APS March Meeting, Dallas, Tx, Mar. 24, 2011.
CLEO Conference, Baltimore, MD., May 2, 2011.
Argonne National Lab, Argonne, IL, May 2, 2011.
Naval Research Lab, Washington, DC Feb. 4, 2011.

* cited by examiner

SYSTEM AND METHOD FOR PRODUCING AND USING MULTIPLE ELECTRON BEAMS WITH QUANTIZED ORBITAL ANGULAR MOMENTUM IN AN ELECTRON MICROSCOPE

STATEMENT REGARDING FEDERALLY SPONSORED RESEARCH/DEVELOPMENT

The subject matter of this patent application was invented under the support of at least one United States Government contract. Accordingly, the United States Government may manufacture and use the invention for governmental purposes without the payment of any royalties.

CROSS-REFERENCE TO RELATED APPLICATIONS

N/A.

BACKGROUND OF THE INVENTION

1. Field of Invention

The present disclosure relates to electron beam production and, more particularly, to the production of electron beams with various types of phase dislocations in scanning imaging instruments.

2. Description of Related Art

Electron beams may be produced having different phase dislocations in an electron microscope. Phase-dislocated beams may be used to provide additional information about a specimen when used for illumination or as a probe in an electron microscope. This additional information may be due to the different interaction between a phase-dislocated electron beam and sample, when compared to conventional electron beams. One type of phase dislocation is a spiral phase dislocation which may be an azimuthal phase that winds around the optical axis an exact integer of a number of times per wavelength. An electron wavefunction having such a spiral phase dislocation may carry quantized orbital angular momentum and possess an associated magnetic dipole. Electron beams having spiral phase dislocations may be used to form atomic resolution images of magnetization in a sample.

In addition to spiral phase dislocations, other types of dislocations may result in other unique beam-specimen interactions. Electron beams having other types of phase dislocations may provide information about the physical structure, composition, optical, electronic and magnetic properties of a specimen.

Many current forms of electron microscopy illuminate specimens with electron beams that have topologically simple wavefronts with no phase dislocations. The scanned beam microscopes (SEM and STEM) may provide information about a specimen or sample by detecting signals generated by the tightly focused probe beam at the specimen. Phase dislocations in the beam may be avoided in order to provide uniform intensity within the smallest possible focal spot. Alternatively, in TEM the specimen may be uniformly illuminated by a wide beam that has flat electron wavefronts. Post-specimen imaging optics may be used to provide spatially-resolved signals to form images.

Recently, several new TEM techniques have been developed to introduce precise phase dislocations onto the electron beam after a sample. These techniques use microfabricated electron optical elements. Depending upon the type of phase dislocation introduced, and its method of use, these techniques can be used to enhance image contrast or provide entirely new types of image contrast altogether. For example, in order to enhance the visibility of weak phase objects in a TEM, such as unstained biological specimens, phase plates may be used to introduce an artificial phase dislocation between low and high transverse spatial frequency components in the transmitted electron beam. This may provide a high contrast, high resolution image in a TEM specimen that may have been otherwise invisible.

Using these new TEM techniques, the phase imprinting is performed after the specimen in a back focal (Fourier) plane. This represents a drawback that the electron optical elements are placed after a specimen in a TEM, as opposed to before the specimen. This timing difference requires that that the specimen be exposed to a higher beam dose since the electron phase-imprinting elements only imprint the desired phase onto a fraction of the electrons that have passed through a sample.

There is a need for an electron beam phase-imprinting technique that imprints phase dislocations before the specimen.

In addition, commercial phase-imprinting devices may imprint the phase dislocation directly using refraction through a material. Accordingly, the shape and material of the structure may be required to be engineered to extremely high tolerances. Moreover, the structure's shape and material may be required to be kept completely clean from surface contamination since local charging may change the electron optical path length. These drawbacks may have so far prevented the widespread use of phase plate-enhanced electron microscopy.

In at least one implementation of a refraction-based phase-imprinting technique of the prior art, a spiral phase dislocation was imprinted onto an electron beam using refraction through a nanoscale phase plate, which was a membrane having a spiral thickness. A drawback of this technique is that it may only work for particular electron beam energies, and it may be difficult to produce quantized phase dislocations (vortices) with integer helicity.

Another drawback of this technique is that it may not be feasible to create steeply spiraled structures that are capable of generating beams with large amounts of angular momentum per particle. As yet another drawback, only one beam with a particular phase dislocation may be produced, so this technique may be not be able to provide a differential contrast signal, which may be formed by comparing interactions between different beams and the sample. Moreover, this refraction-based spiral phase-imprinting technique demonstrated only the phase imprinting and did not obtain images of other samples. Only the phase plate itself was imaged.

There is a need for a phase-imprinting technique that overcomes the above-mentioned drawbacks.

In at least one other implementation of the prior art, electron beams with spiral phase singularities were produced in an electron microscope using diffractive holograms. This prior art became available after the invention of the present disclosure. This technique demonstrated a magnetic dichroistic signal in a specimen by alternating between beams having spiral dislocations to analyze a different specimen. However, this technique cannot be used to provide high resolution images using this dichroistic signal without significantly modifying the optics of the TEM. In this implementation, the hologram mask was used as a post-specimen image filter in the Fourier plane in a conventional TEM imaging arrangement.

There is a need for an electron phase-imprinting technique that provides high-resolution images.

BRIEF SUMMARY OF DISCLOSURE

The present disclosure addresses the needs described above by providing a system for producing and using multiple electron beams with quantized orbital angular momentum. The system comprising a nanoscale diffractive hologram device having a pattern disposed therein. The system further includes an illumination element configured to illuminate the diffractive hologram device with electrons, thus causing said electrons to diffract into at least one electron beam having phase dislocations based on the pattern of said diffractive hologram device.

The diffractive hologram device is configured to be placed in the electron optical column of a electron probe beam instrument such that the at least one electron beam having phase dislocations is configured to be directed onto a specimen.

In another embodiment of the present disclosure, a system is provided for producing and using multiple electron beams with quantized orbital angular momentum. The system comprises a nanoscale diffractive hologram having a pattern disposed therein. The system further comprises an electron probe beam instrument having an illumination element, the illumination element being configured to illuminate the diffractive hologram device with electrons, thus causing said electrons to diffract into at least one electron beam having phase dislocations based on the pattern of said diffractive hologram device. The diffractive hologram device is placed in the optics of the electron probe beam instrument such that the at least one electron beam having phase dislocations is configured to be directed onto a specimen.

In another embodiment of the present disclosure a method is provided for producing and using multiple electron beams with quantized orbital angular momentum. The method comprises providing a nanoscale diffractive hologram having a pattern disposed therein, and placing the nanoscale diffractive hologram into the electron optical column of an electron probe beam instrument.

The method further comprises illuminating the diffractive hologram device with electrons, thus causing said electrons to diffract into at least one electron beam having phase dislocations based on the pattern of said diffractive hologram device; and causing the at least one electron beam having phase dislocations to be directed onto a specimen.

These, as well as other objects, features and benefits will now become clear from a review of the following detailed description of illustrative embodiments and the accompanying drawings.

DETAILED DESCRIPTION OF THE DISCLOSURE

Figure 1A:
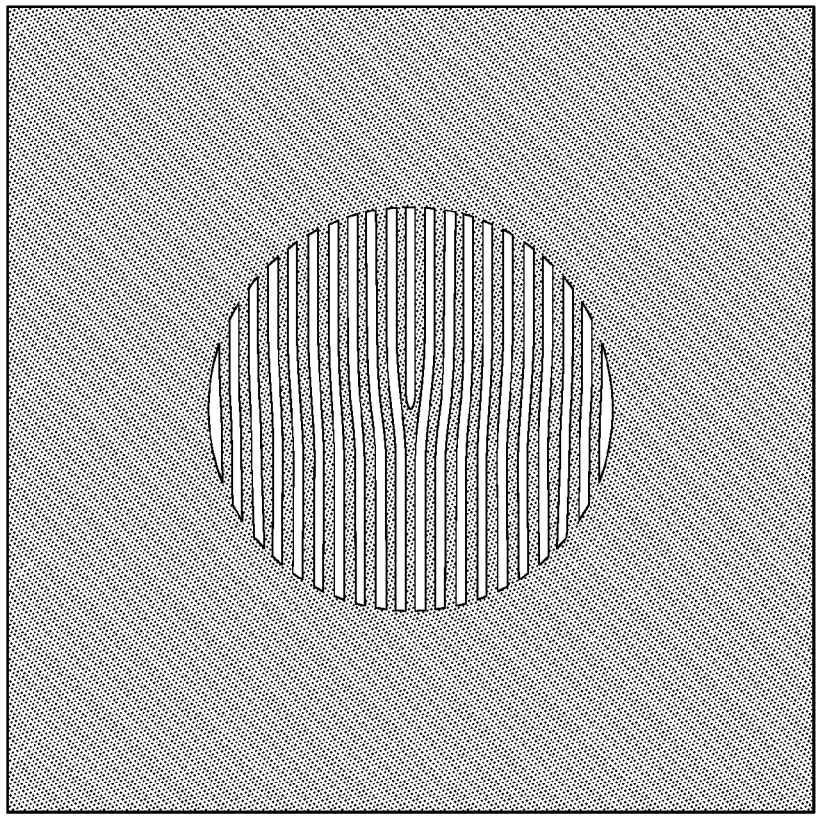
FIGS. 1A-1G illustrate diffractive hologram designs in accordance with embodiments of the present disclosure.

A system and method are described for producing electron probe beams with engineered phase dislocations in electron-producing imaging instruments, including electron microscopes. These beams may be used to provide information about a specimen that may not otherwise be available. Different phase dislocations may result in various unique beam interactions with a specimen.

The system and method of the present disclosure differ from the prior art in that they incorporate a scanned electron probe arrangement. Accordingly, phase dislocations may be imprinted onto the electron beam before the specimen, as opposed to after the specimen like the prior art. The present system and method also incorporate use of a diffraction hologram, as opposed to a refractive hologram. The techniques described herein provide for practical and useful electron optical elements that are capable of being reliably, reproducibly and economically manufactured. These techniques are also robust and long-lasting, resistant to beam damage, and work over a large range of beam energies.

In addition, the techniques described herein may produce high quality electron wavefront dislocations with precisely defined topology. In the case of electron beams with spiral phase dislocations, the present technique produces electrons in single orbital eigenstates with exactly integer multiples of $\hbar$ (h-bar, reduced Planck's constant) units of orbital angular momentum per electron. The present technique also provides a way to rapidly select between beams of different phase dislocations in order to provide a comparative dichroistic signal.

In accordance with the techniques described herein, the generation of probe beams with spiral phase dislocations is explored. Beams with spiral phase dislocations are unique in that each electron carries quantized orbital angular momentum (OAM), which can be used for a variety of new materials analysis in an electron microscope due to the unique interactions afforded by this OAM.

For example, an electron wavefunction that has a spiral phase dislocation may not only carry quantized OAM, but it possesses an associated magnetic dipole. Such beams may be used to form atomic resolution images of magnetization in a sample. The system described herein uses the principle of diffraction to produce electron beams with phase dislocations. A material nanostructure may act as a diffractive holographic element (transmission hologram) for electron de Broglie waves. The hologram pattern may simulate the interference between the desired electron wavefront topology and a reference wave. Illumination of the pattern by a real electron wave may then recreate the desired wavefront topology through electron diffraction. A number of different types of phase dislocations may be generated using the diffractive holograms of the present disclosure. FIGS. 1A-1G illustrate examples of patterned diffractive holograms that may be used to create phase dislocations. The phase dislocations may be created according to the patterns in the holograms. When lower energy electrons (e.g. in a SEM) are used, it may be desirable to cut the pattern all the way through the membrane material of the diffractive hologram. When higher energy electrons (e.g. in a STEM) are used which pass right through the thin material, it may be desirable to use slits or holes that are formed by removing only part of the membrane material. Alternatively, for high energy electrons, material could be added to the thin membrane instead of cutting parts of the membrane surface away.

Referring now to FIG. 1A, illustrated is a diffractive hologram for generating a spiral phase dislocation in accordance with one embodiment of the present disclosure. Electron beams with spiral phase dislocation may be formed by forked grating holograms such as the one illustrated in FIG. 1A. The forked grating hologram may be an array of holes or slits that have an extra half-row or half-slit that form a fork dislocation.

The forked grating of FIG. 1A may be used when the sample to be illuminated by the imaging instrument is composed of magnetic materials such as iron, cobalt and nickel. However, any magnetic material may be used. This grating may produce a beam in the first diffraction order which may be used to gather information about a sample. Each electron in the resulting first diffracted beam may contain one unit of orbital angular momentum (OAM). By transferring this OAM from the beam to an atom in the specimen, the atom's magnetic moment may be determined. This diffraction grating may also produce a second beam with OAM equal in magnitude but opposite in direction to the first, which may be used to gather information about a sample. In addition, a third beam that is a central beam may be produced without phase dislocation. Additional information about the sample may be determined from this beam as well.

Figure 1B:
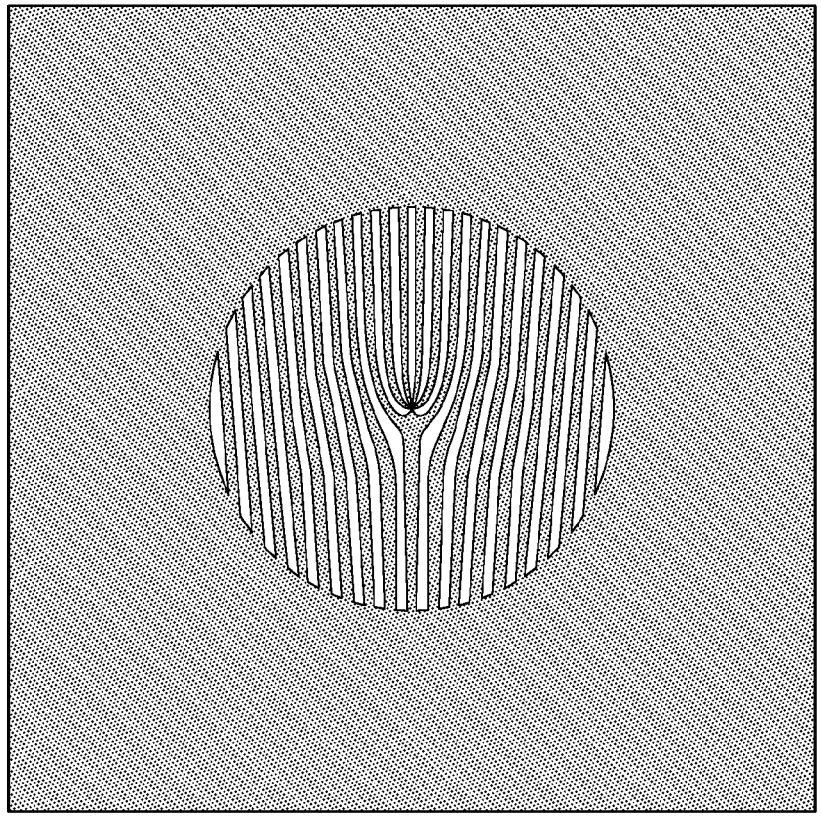

Referring now to FIG. 1B, illustrated is a variation of the forked design of FIG. 1A in accordance with one embodiment of the present disclosure. This hologram design of FIG. 1B may simulate the forked interference pattern formed between an idealized beam with helical wavefronts and a reference wave. When this holographic element is illuminated with coherent electrons, the electrons may diffract into multiple discrete beams that each possess a well-known spiral phase dislocation (much like the electron equivalent of Laguerre-Gaussian beams).

The pitch and winding direction of the helical electron wavefronts (or the topological charge helicity) is equal to the diffraction order number, which is a signed integer, times the number of extra half-rows or half-slits forming the hologram fork dislocation. Each electron in beams produced using these diffraction gratings may possess a quantized amount of orbital angular momentum (OAM) and a magnetic dipole moment, both of which may be proportional to the topological charge of the phase dislocation in the beam. These unusual beam properties may lend themselves to new forms of electron imaging, including electron microscopy and/or spectroscopy, as discussed herein.

The hologram grating of FIG. 1B may be used with non-magnetic materials. If the user wishes to access the atomic behavior of a material, it may be useful to illuminate the material with electrons having higher amounts of angular momentum. The forked hologram variation of FIG. 1B may provide the desired higher amounts of angular momentum. The forked grating variation illustrated in 1B may provide five units of angular momentum per electron.

Figure 1C:
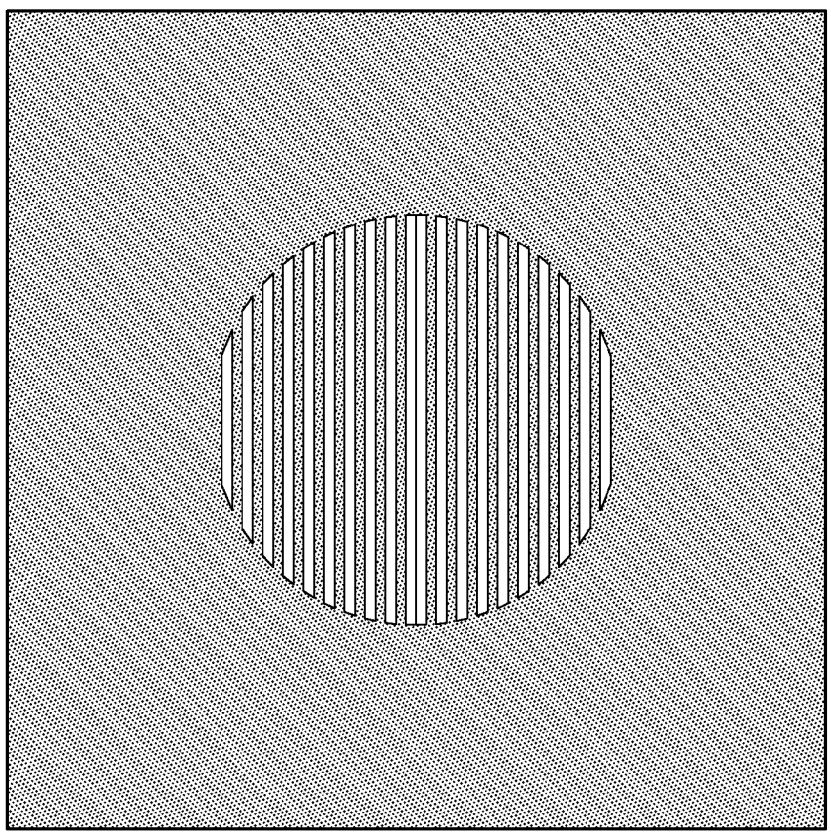
Figure 1D:
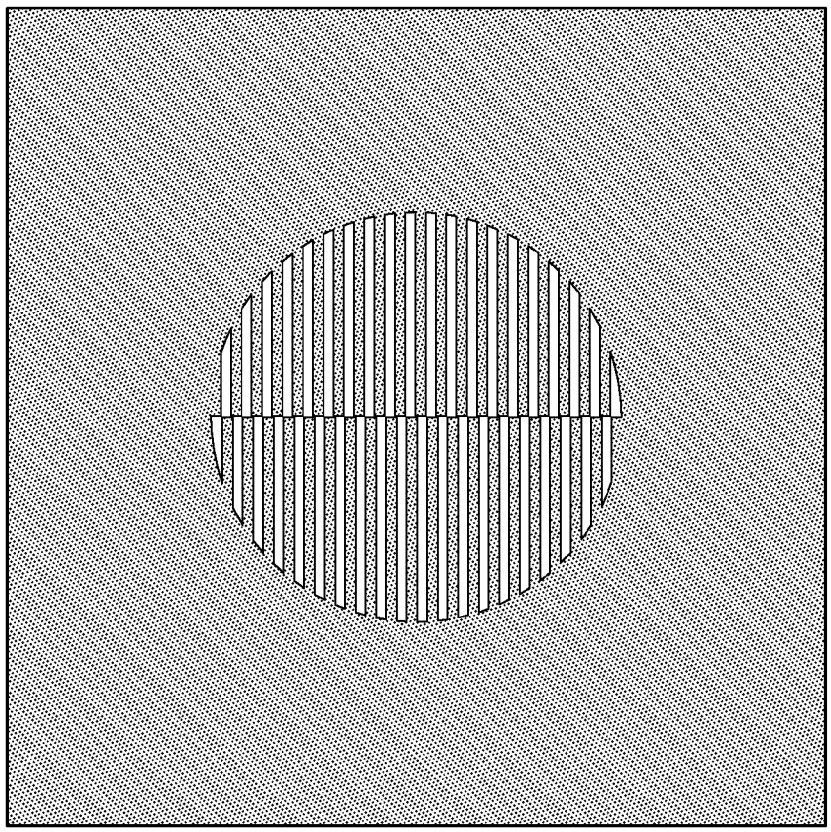

Other types of electron wavefront dislocations may also be realizable using different hologram gratings. For example, electron beams with wavefronts that have edge dislocations may be produced using holographic gratings that have regions in which the slits are one hundred eighty degrees (180°) out of phase with adjacent regions. These beams are much like the electron equivalent of Hermite-Gaussian beams. Referring now to FIG. 1C, illustrated is an example of a grating that can be used to form Hermite-Gaussian type beams in accordance with an embodiment of the disclosure. This particular grating is designed to produce a Hermite-Gaussian electron beam with vertically-oriented edge-type wavefront dislocation. The resulting electron beam will not have a uniform phase. If the user wishes to compare beam with edge dislocations that a half a wavefront off from the other beams, this grating may be desired. If a horizontally-oriented edge-type wavefront dislocation is desired, the grating design of FIG. 1D may be used.

Figure 1E:
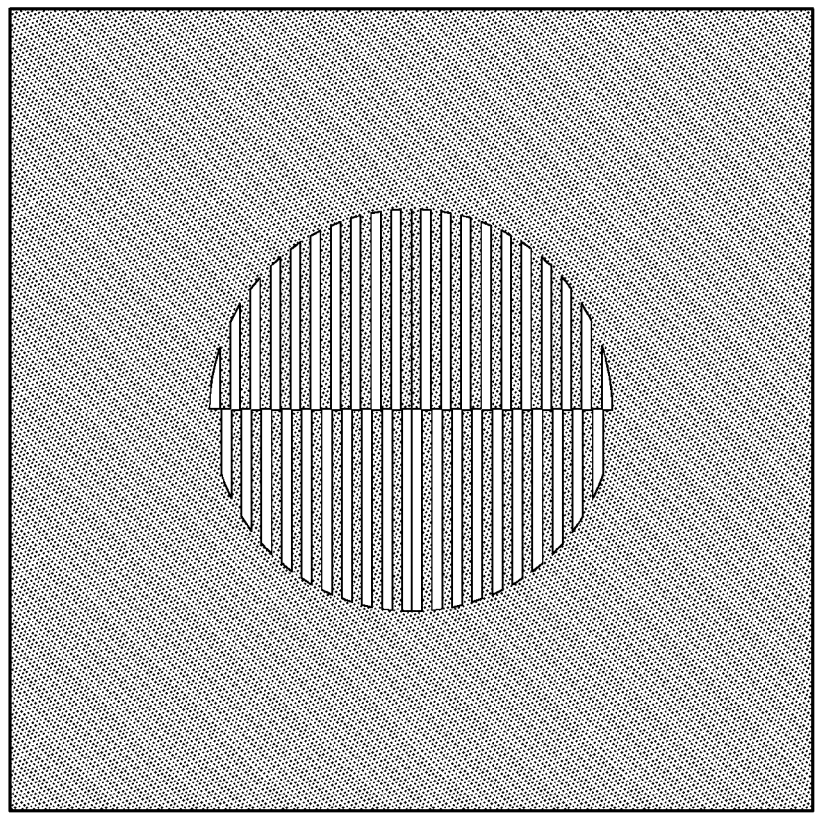

Higher order Hermite-Gaussian beams may be produced in a similar fashion. Referring now to FIG. 1E, illustrated is a hologram designed to produce a higher-order Hermite-Gaussian electron beam. The resulting electron beam would have both horizontally- and vertically-oriented edge-type wavefront dislocations. These beams may have multiple probe spots in the same beam.

Figure 1F:
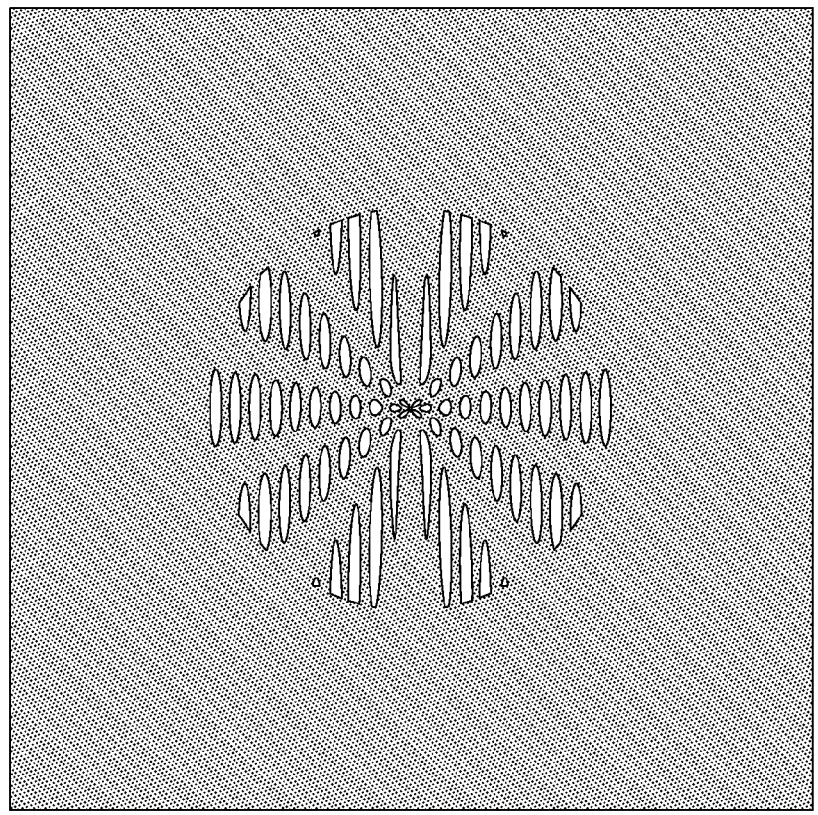

Linear superpositions of different phase dislocations may be imprinted onto an electron beam using more complex holograms. For example, a hologram having two superposed forked gratings—with one forked grating flipped upside down with respect to the other forked grating—may give rise to an electron beam in superposed positive and negative OAM states with a "beaded necklace" beam intensity profile. Referring now to FIG. 1F, illustrated is a hologram designed to produce such a beaded necklace beam intensity profile. This particular hologram is designed for superposed positive and negative OAM with topological charge of +5 or −5 states. As shown, the hologram includes, on one side, five beaded lines extending radially outward from the center. On the other side, the same is true: five beaded lines extend radially outward from the center. Using this hologram, the OAM-dependent interactions of electrons with a specimen may be measured using the same beam. The beam may be used to measure not only magnetization, but also magnetic fields and structural properties of a material, such as chirality of constituent molecules.

This hologram may be used to create a beam in which each electron is in a superposition of clockwise and counterclockwise orbits. Each electron may have a north pole-up/south pole-down orientation superposed onto a south pole-up/north pole-down orientation. The magnets may be slowed down or sped up depending on whether the magnets are aligned with the field.

Figure 1G:
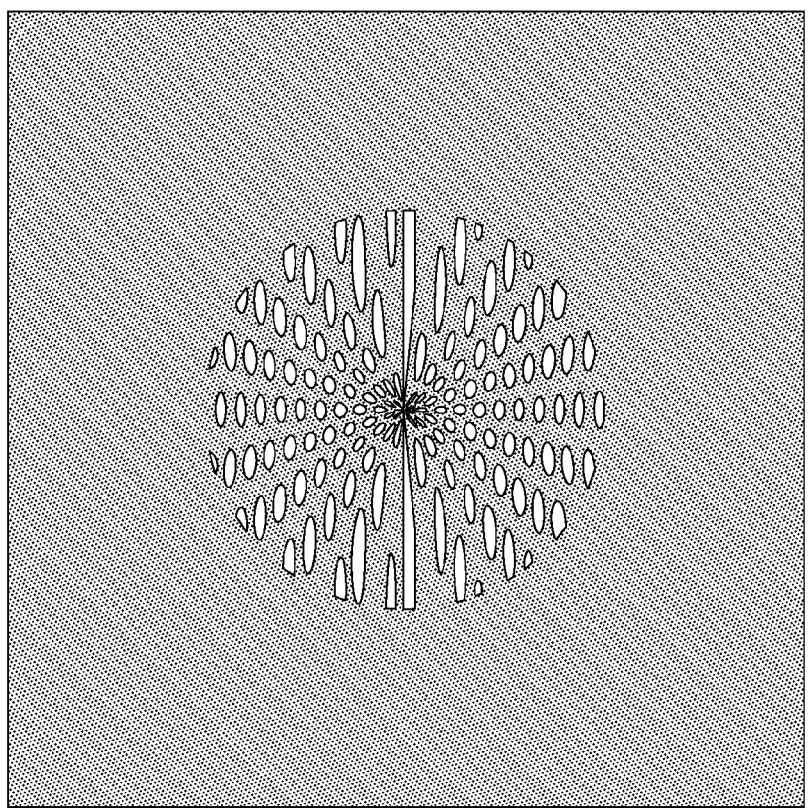

Referring now to FIG. 1G, illustrated is a hologram similar to the hologram of FIG. 1F, but is designed for superposed positive and negative OAM with topological charge of +10 or −10 states.

The diffractive holograms of the present disclosure may be composed of materials such as silicon nitride or platinum. The diffractive holograms of the present disclosure may also be made of a carbon thin film, diamond thin film, or silicon membrane. The diffractive hologram may be thin, e.g., thirty nanometers (30 nm) thick, but probably not thicker than one micron. The patterns may be created on the diffractive holograms by puncturing holes or slots that go partially through the hologram. It should also be understood that, in lieu of a hologram, other ways of imprinting the beam may be accomplished without departing from the spirit and scope of the invention. A high intensity laser could be used in lieu of a hologram. The laser may be configured to create the same pattern as the hologram.

In lieu of using any single hologram such as those illustrated in FIGS. 1A-1G, one may even combine the holograms. The decision may first be made as to the type of beam desired, what properties it may have, and what unique information about a specimen those properties may provide. The beam may be shaped based on the hologram design.

Electron diffraction holograms may be designed to act as amplitude masks, phase masks or a combination thereof. An amplitude mask hologram may modulate the transverse intensity profile of the electron beam by selectively absorbing or scattering particles. A phase mask hologram may modulate the wavefront phase of the electron beam by locally varying the electron optical path length, either by changing the effective index of refraction (the mean inner potential) or the projected material thickness. It may be desirable to use a phase mask hologram. For example, such a phase mask hologram may be more efficient, since there is little absorption and a significant number of electrons may be used to form the diffraction pattern.

The hologram's masking behavior may be determined by the energy of the electron beam, which can also influence the optimum hologram pattern design. By way of example, a hologram having holes or slits milled through a thin membrane may behave as an amplitude mask for low energy electrons. The material absorbs and scatters electrons while the through-holes coherently transmit the electrons. Using the same hologram structure, a phase mask behavior can be created for high energy electrons since both the holes and thin material can coherently transmit electron waves, although with a relative phase shift depending on the thickness difference. Phase mask holograms for high-energy electrons, such as those used in STEM probe beams, can be fabricated on top of an electron-transparent supporting membrane. Thus, the hologram need not support itself. For low-energy electrons, an amplitude mask such as those used in SEM beams must include supporting cross braces in order to support itself.

The diffractive hologram may be designed to generate one electron probe beam or multiple diffracted beams with different wavefront dislocations. For example, a hologram having a symmetric thickness profile may simultaneously produce pairs of electron probe beams with phase dislocations that are equal in magnitude but opposite in sign. This hologram with symmetric thickness may also simultaneously produce a central ($0^{th}$) diffraction order that provides a conventional electron probe beam with no phase dislocation, which can be used to provide a reference signal or image with which to compare signals or images generated by different probe beams. If desired, the thickness profile of the hologram can also be tailored to form a blazed diffractive hologram that produces only probe beams having a particular magnitude and/or sign of phase dislocation.

The diffraction hologram may be placed in the probe-forming optics of a scanning electron probe instrument, including a scanning electron microscope (SEM) or scanning transmission electron microscope (STEM), an electron spectrometer, or any other instrument that produces images or measurements of a specimen using a positionable, focused electron beam as a signal-generating probe.

Figure 2A:
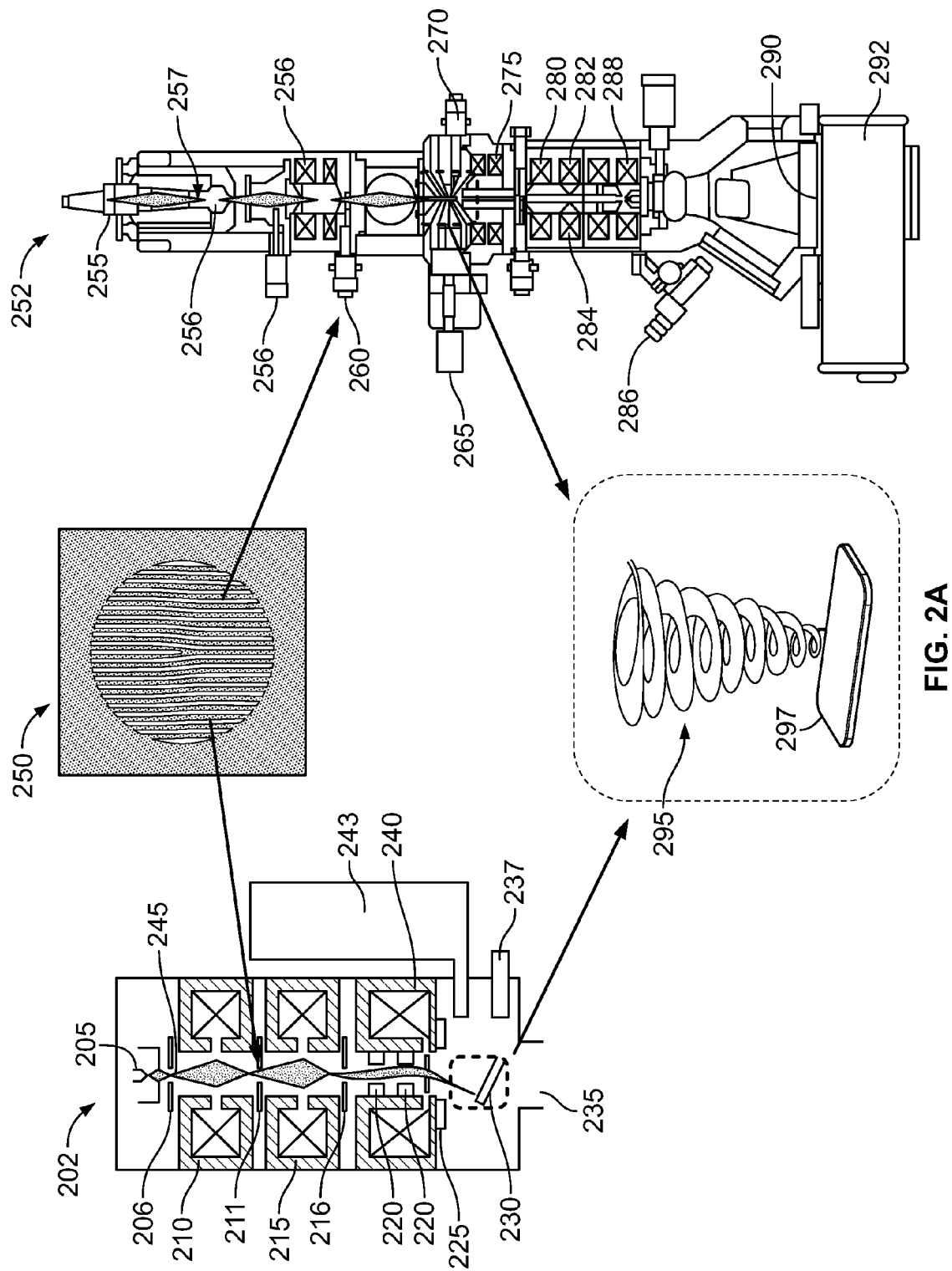
FIG. 2A illustrate the placement of the diffractive holograms of FIGS. 1A-1G in a scanning electron microscope and a scanning transmission electron microscope in accordance with embodiments of the present disclosure.

Referring now to FIG. 2A, illustrated is the placement of the diffractive holograms of FIGS. 1A-1G in a SEM and a STEM in accordance with embodiments of the present disclosure. Hologram 250 may be placed into the probe-forming optics of either a SEM 202 or a STEM 252. As shown in FIG. 2A, the hologram has been placed between the first condenser lens 210 and the second condenser lens 215 of the scanning electron microscope 202.

When the SEM 202 is in operation, an electron beam 245 may be directed through the probe-forming optics of the SEM 202, resulting in a phase-dislocated electron probe beam 295 that illuminates specimen 297. The probe-forming optics of scanning electron microscope 202 include electron gun 205, electron gun lens aperture 206, a first condenser lens 210, a condenser lens aperture 211, a second condenser lens 215, an objective lens aperture 216, deflection coils 220, and an objective lens 240. In addition to the probe-forming optics, shown are a backscatter electron detector 225, a vacuum pump 235, a secondary electron detector 237, and an X-ray detector 243. In the present illustration, the hologram 250 is placed in the condenser lens aperture 211 between the first condenser lens 210 and the second condenser lens 215. However, it should be understood that the hologram could be placed in other locations, depending upon the optics. However, it is desirable that the hologram 250 be placed before the specimen 297, as opposed to after the specimen 297. Moreover, it is desirable that the specimen be placed in the electron optical column, i.e., after the electron source (in this case, the electron gun) and before the specimen 297.

In a STEM 252 such as the one shown in FIG. 2A, the probe-forming optics include an electron gun 255, an electron gun lens aperture 256, a first condenser aperture 256, a condenser lens 256, a second condenser aperture 260, and a specimen port 265. In a STEM with conventional TEM imaging capabilities such as the one shown in FIG. 2A, the post-specimen imaging optics include an objective aperture 270, an objective lens 275, a diffraction lens 280, an intermediate aperture 284, an intermediate lens 282, projector lenses 288, binoculars 286, a fluorescent screen 290 and an image recording system 292. In the present illustration, hologram 250 has been placed in the condenser aperture 260 of STEM 252. It should be understood that the condenser lens aperture is sometimes referred to as a condenser aperture.

Steps may be taken by the user to ensure that the delocalized electron wavefunctions sample the entire area of the diffractive hologram 250. For example, the hologram 250 may be placed in between crossover points (beam foci or waists) where the electron beam (245 in SEM 202, 257 in STEM 252) is sufficiently spread out (defocused). For example, in a SEM, the hologram could be placed in the condenser lens aperture 211, the gun lens aperture 206 or objective lens aperture 216. In a STEM, the hologram could be placed in the second condenser lens aperture 260 or another aperture in the probe-forming optics between the specimen and electron gun. It should be understood that in some dedicated STEM instruments, the objective aperture is located before the specimen, and would provide a suitable location for the hologram.

It may also be desirable to ensure that the electron beam 245 or 257 transmits through the same area of hologram 250 even when the probe beam is tilted during alignment or during an image scan.

Placing the hologram 250 at an aperture in the electron optics column may help to transmit the beam 245 or 257 through the same area of the hologram 250. A condenser lens aperture 260 or objective lens aperture 216 may be a desirable location. If the condenser lens aperture 260 were manufactured such that it was combined with the diffraction hologram 250 into a single element, it may aid even further to ensure that electron beam 245 or 257 transmits through the same area of hologram 250. This combination may be further desirable because it can be easily installed in existing instruments.

The probe-forming optical elements of either SEM 202 or STEM 252 may be used to focus, stigmate and/or scan the electron probe beams that have been diffracted from the hologram 250. For diffraction holograms that produce multiple electron beams, it may be necessary to isolate each signal generated by each beam in order to form a proper image of specimen 297. Isolation may be accomplished by selecting and using a single beam at a time as a probe to scan across the sample 297. This mode of isolation may be implemented using an aperture placed in between the hologram 250 and the specimen 297. Electron beams with a particular phase dislocation may be rapidly selected to form a probe beam. A selecting aperture may come as a standard feature on an electron microscope. These features may facilitate steering the desired beam through a selecting aperture.

Alternatively, isolation may be accomplished by scanning all beams across the sample 297 simultaneously while using a position-sensitive detector to differentiate signals generated by different probes. This mode of isolation may be implemented in a number of ways, depending on the instrument and signal used to form the image. For example, in a STEM instrument, a post-specimen aperture may be used to select only the signal being generated in the area of the sample scanned by a particular probe beam.

Figure 2B:
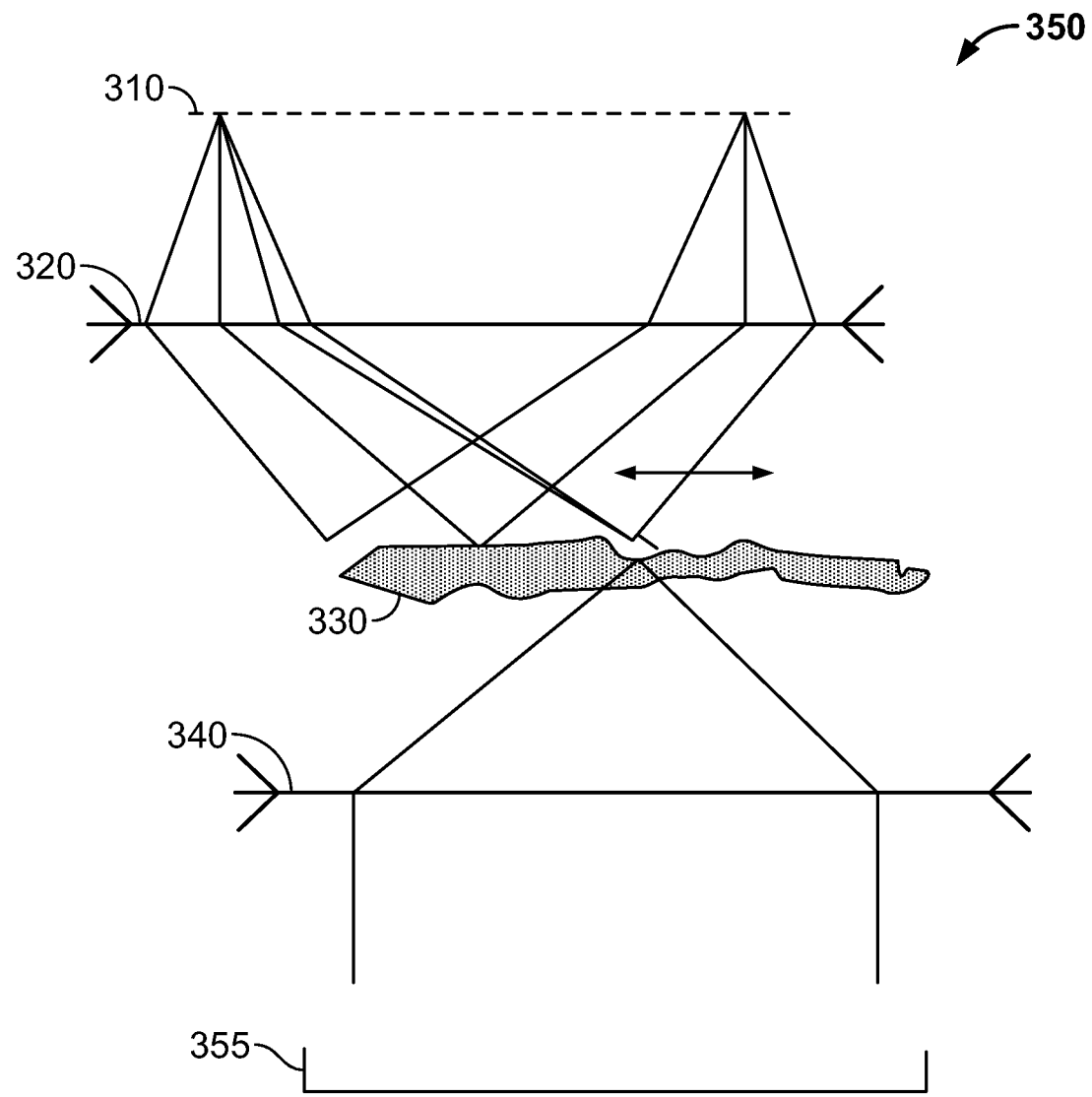
FIG. 2B is a schematic of an aperture in a scanning transmission electron microscope in accordance with one embodiment of the present disclosure.

Referring now to FIG. 2B, illustrated is a simplified schematic of an aperture in a scanning transmission electron microscope in accordance with one embodiment of the present disclosure. This schematic shows the general arrangement of the hologram in relation to the aperture, the scanned OAM beam and the specimen. As shown in FIG. 2B, the hologram 310 may be placed in an energy spectrometer 355 before lenses 320, 340 and before specimen 330. The scanned OAM beam 350 may be directed across specimen 330.

Figure 3:
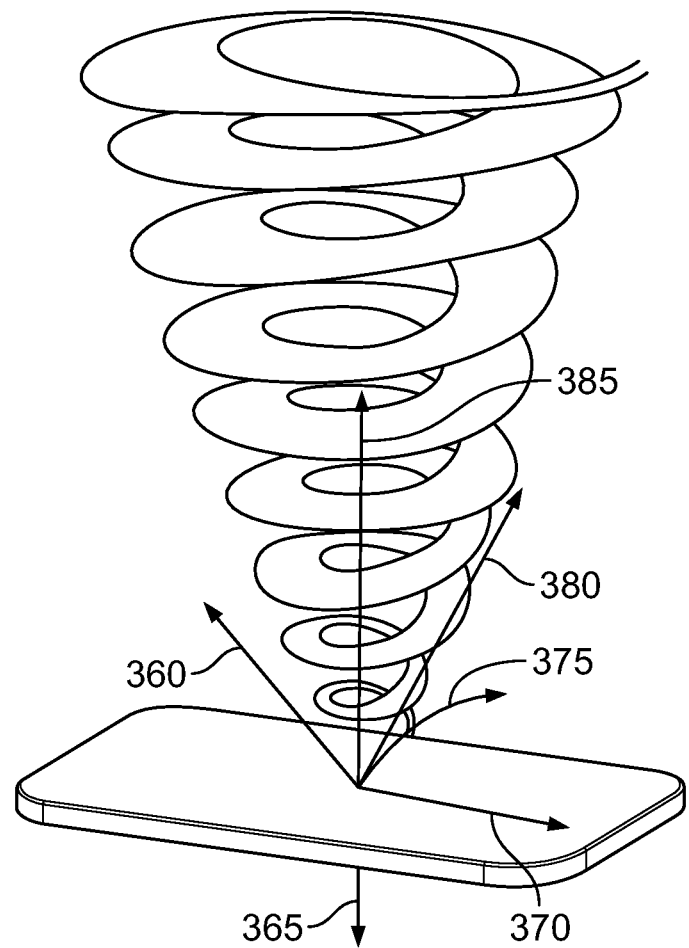
FIG. 3 illustrates beam property-dependent signals that may result from embodiments of the disclosure.

Signal generation and image formation for the apparatus and method of the present disclosure may be performed much like in a regular STEM. Referring now to FIG. 3, illustrated is an example of the beam property-dependent signals generated using the present invention. The signals include backscattered electrons 360, transmitted electrons 365, absorbed electrons 370, secondary electrons 375, X-rays 380, and cathodoluminescence 385.

The enumerated beam property-dependent signals may be measured using stock detection methods. For example, a number of detection methods exist for measuring signals for outgoing electrons, including energy loss of the electrons. These detection methods include, but are not limited to, secondary electron (SE) detection, backscattered electron (BSE) detection, electron energy loss spectroscopy (EELS), auger electron spectroscopy (AES), scanning electron microscopy with polarization analysis (SEMPA), and absorbed current detection methods. Specific detectors that may be used include, but are not limited to, an EELS detector, a high angle annular dark field (HAADF) detector, a bright field detector and a SEMPA detector. As far as outgoing photons, a number of detection methods exist for measuring signals from these as well. The methods include, but are not limited to, cathodoluminescence (CL), energy dispersive X-ray spectroscopy (EDS) and wavelength dispersive X-ray spectroscopy (WDS). Detection devices that may be used for outgoing photons include CL detectors, energy dispersive X-ray spectrometers, wavelength dispersive spectrometers, SE detectors, Everhardt-Thornley detectors, BSE detectors and absorbed current detectors. The invention uses existing techniques and augments them to provide a beam from which additional information can be obtained about a sample.

Images may be formed by scanning a focused electron beam across a sample while monitoring the number, momentum, polarization and/or energy of electrons and/or photons exiting the sample. These elements combine to form the signal. This signal may be compared to the signal generated by another probe beam emanating from the hologram. The difference in these two signals generated by different beams may be used to provide a new image or measurement of the sample.

Figure 4A:
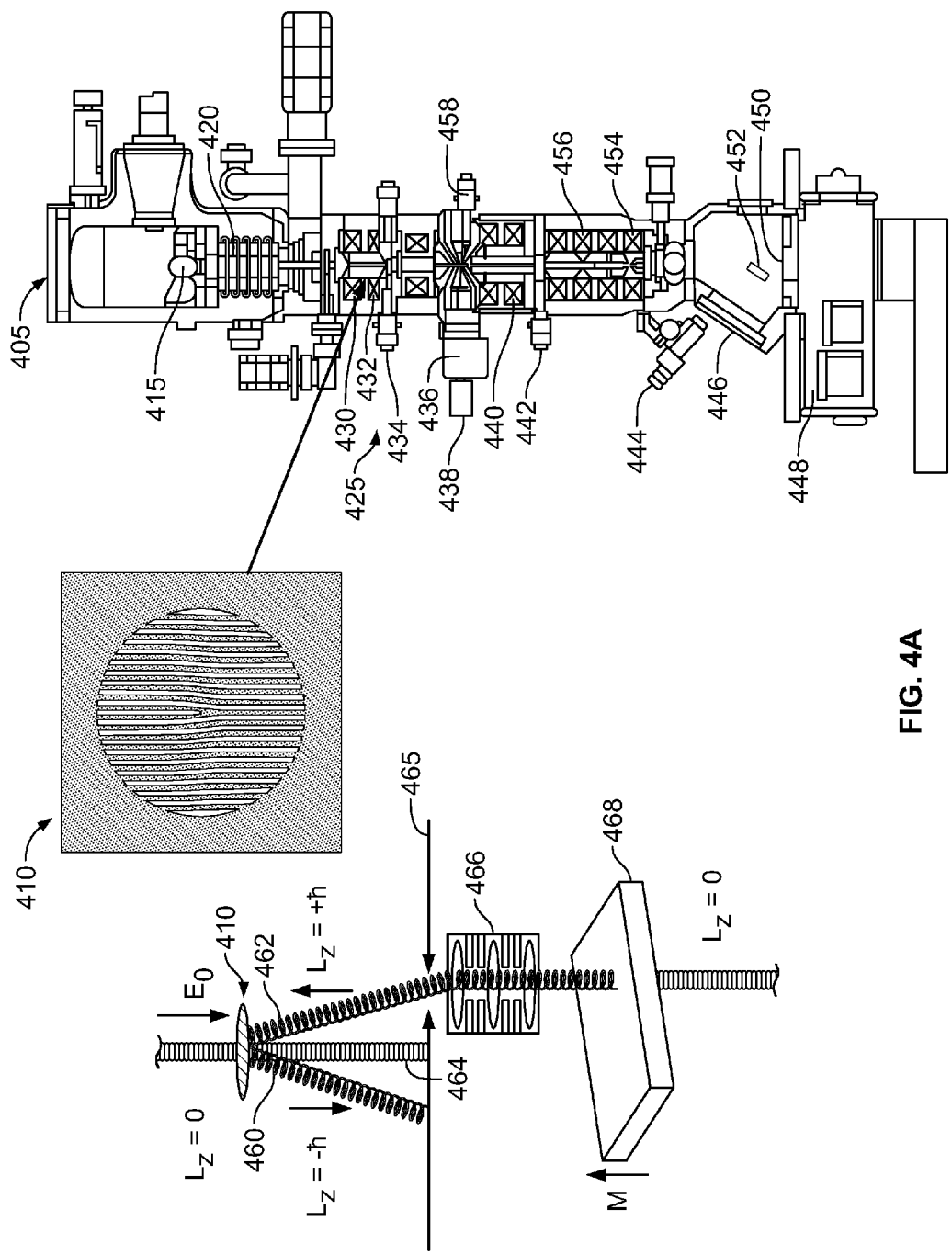
FIG. 4A illustrates a STEM and electron energy loss spectrometer used to analyze a vortex beam probe in accordance with one embodiment of the present disclosure.

Referring now to FIG. 4A, this figure illustrates a STEM and electron energy loss spectroscopy used to analyze a vortex beam probe in accordance with one embodiment of the present disclosure. Although the present illustration shows the invention in use with electron energy loss spectroscopy, it should be understood that a number of techniques would be available using the STEM, including but not limited to auger electron spectroscopy, scanning electron microscopy with polarization analysis, and absorbed current detection methods for the outgoing electrons. Techniques would also be available for outgoing photons, including without limitation, cathodoluminescence, energy dispersive X-ray spectroscopy and wavelength dispersive spectroscopy.

On the right side of FIG. 4A, an electron microscope 405 is illustrated with a forked grating hologram 410 placed in its probe-forming optics. To the left side of FIG. 4A, a vortex beam is illustrated as it travels through a STEM. The electron microscope 405 includes an acceleration tube 420, an electron gun 415, a first condenser lens 430, a second condenser lens 32, a condenser aperture assembly 434, a goniometer 436, a specimen holder 438, an objective lens 440, a selected field aperture 442, binoculars 444, a viewing port 446, a camera chamber 448, a large fluorescent screen 450, a small fluorescent screen 452, a projector lens 454, an intermediate lens 456, an objective aperture 458. Here, the hologram grating 410 has been placed between the first condenser lens 430 and the second condenser lens 432 of STEM 405. It was not placed in a lower aperture because it must be placed before the specimen which would be contained in specimen holder 438.

Here, the forked grating hologram 410 is designed to produce spiral phase dislocations. To the left side of FIG. 4A is an example of the types of vortex beams produced when the STEM 405 illuminates the forked hologram grating 410. Before the beam enters the forked grating hologram 410, it is a single beam with its original beam energy ($E_0$).

After the original beam enters the grating, three beams 460, 462, 464 result. Resulting beams 460, 462 are spiral phase-dislocated beams. Both spiral phase-dislocated beams 460, 462 are corkscrew-shaped. However, spiral phase dislocated beam 460 rotates in a clockwise direction, while spiral phase-dislocated beam 462 rotates in a counter-clockwise direction. Each of these spirally phase-dislocated beams 460, 462 have substantially equal magnitude to each other. However, the magnitude of the spiral phase-dislocated beams may be different from that of central beam 464. After the beam passes through the forked grating hologram 410, the resulting beams will have the same original energy ($E_0$).

Only one of the beams, beam 462, may pass through aperture 465 at a time so that it alone can reach the STEM optics 466 and be focused onto the sample 468, which in this example, is composed of a magnetic material such as iron, cobalt or nickel. It should be noted that it may be desirable for the sample 468 to be thin so that electrons can transmit through it. It should also be noted that the electrons may lose certain values of energy and OAM as they pass through sample 468. This loss in energy may be measured using an EELS detector.

The difference in signals that result from beams 460, 462, 464 as they pass through the sample 468 may be used to obtain additional information about the sample. For example, if one were looking at transmitted electrons in the sample, some of those electrons will have lost energy. If desired, instead of looking at all three resulting beams 460, 462, 464, one could suppress one of any of beams 460, 462, 464. Every electron in the resulting two spiral phase-dislocated beams 460, 462 will have a well-defined orbital angular momentum (OAM).

The angular momentum of first spiral phase-dislocated beam 460 will be substantially the opposite of second spiral phase-dislocated beam 462. The difference between the angular momentum of beams 460, 462 may be expressed as 2 h-bar. If one were using all beams to generate a signal, differences in these signals would be difficult to discern. Therefore, it may be desirable to filter the beam so that one of beams 460, 462, 464 hits the sample at a time. The user/operator may manually select the desired beam using standard equipment such as a selecting aperture in the beam forming optics, or may alternatively use beam alignment coils to automatically steer the desired beam through the selecting aperture.

It should be noted that the spiral phase-dislocated beams 460, 462 will be hollow in the middle and form a ring on the sample. However, central beam 464 would be uniform in intensity. Comparison of the signal generated by the various beams 460, 462, 464 may be performed using software or manual calculations. The comparison may give magnetic information about the sample. For example, it could be determined whether the area being probed on the sample is north pole on top and south pole on bottom. Depth perception of the two beams 460, 462 could also be obtained since one spiral phase dislocated beam 460 may be seen at a different angle from beam 462.

If using the central beam 464 with no OAM to obtain information about a sample 468 using EELS analysis, one might see a change in an EELS signal when using one of the spiral beams 460, 462, with OAM.

Conventional STEM techniques use a conventional probe beam with no phase dislocations, designed solely to produce a signal from as small a volume as possible. In this arrangement, images may be formed by measurement signals that only depend upon the position of the probe on the sample. The system and method of the present disclosure differ from conventional techniques in that the signal also depends upon the engineered phase dislocation present in the probe beam.

Electron beams having phase dislocations may interact differently with samples compared to conventional beams. Phase-dislocated beams may provide additional structural, chemical, crystallographic, optical, electronic, and magnetic information about the specimen. In some cases, this information can be revealed in a single scan using a phase-engineered probe beam. However, in general, the desired contrast is obtained by comparing two signals generated by alternating probe beams with different phase dislocations.

Electron beams with spiral phase dislocations may interact asymmetrically with magnetic materials. Electrons in beams with spiral phase dislocations may possess well-defined, quantized OAM that can be transferred to a sample. This transfer process may depend on the orientation of the local magnetic and electronic structure of the sample relative to the beam electron's OAM. Thus, the electron's scattering amplitude (the mean free path, scattering coefficient, deflection angle, etc.) depends upon the magnitude and sign of the beam's spiral phase dislocation, which can be used to form magnetic images of a sample by monitoring the normal STEM measurement signals while alternating between beams of opposite helicity.

Figure 4B:
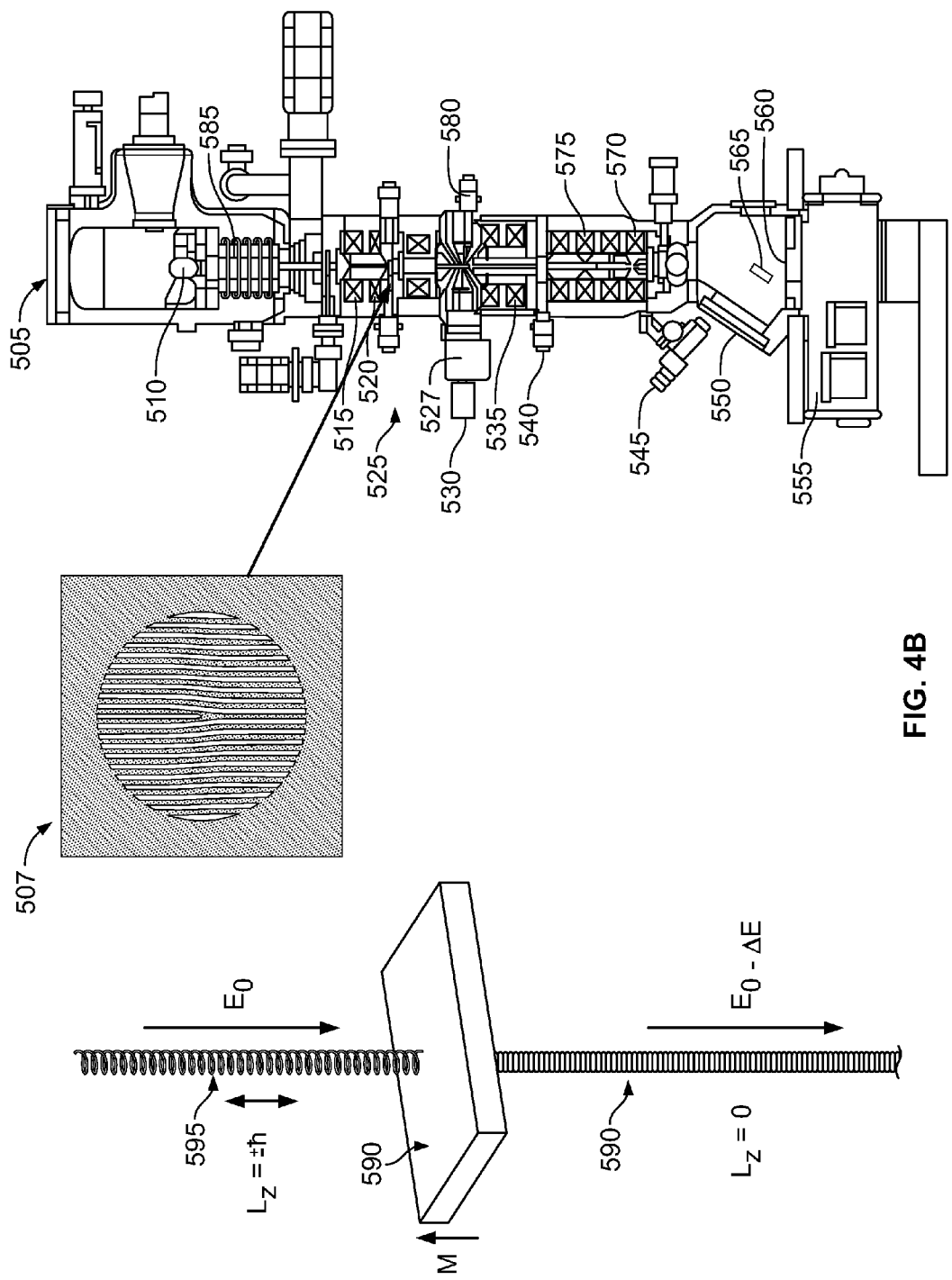
FIG. 4B illustrates a STEM and electron energy loss spectrometer used to analyze an electron probe beam carrying orbital angular momentum in accordance with one embodiment of the present disclosure.

Referring now to FIG. 4B, illustrated is a STEM where electron energy loss spectroscopy is used to analyze a single electron probe beam carrying orbital angular momentum in accordance with one embodiment of the present disclosure. As shown to the right of FIG. 4B, the STEM 505 has an electron gun 510, a first condenser lens 515, a second condenser lens 520, a condenser aperture assembly 525, a goniometer 527, a specimen holder 530 for holding specimen 590, an objective lens 535, a selected field aperture 540, a binocular 545, a viewing port 550, a camera chamber 555, a large fluorescent screen 560, a small fluorescent screen 565, a projector lens 570, an intermediate lens 575, an objective aperture 580, and an acceleration tube 585. The hologram 507 is placed into the condenser aperture assembly 525.

Here, as shown to the left of FIG. 4B, a spiral phase-dislocated electron beam 595 having energy ($E_O$) enters is directed onto specimen. Here, the specimen 590 is composed of iron, cobalt, nickel or other magnetic material. After the spiral phase-dislocated electron beam 595 has been directed onto specimen 590, it loses energy. The angular momentum of beam 595 is ±h-bar, and goes to zero after it hits the specimen.

While the specification describes particular embodiments of the present invention, those of ordinary skill can devise variations of the present invention without departing from the inventive concept.

I claim:

1. A system for producing and using multiple electron beams with quantized orbital angular momentum, the system comprising:
    a nanoscale diffractive hologram device having a pattern disposed therein;
    an illumination element configured to illuminate the diffractive hologram device with electrons, thus causing said electrons to diffract into at least one electron beam having phase dislocations based on the pattern of said diffractive hologram device; and
    wherein the diffractive hologram device is configured to be placed in an electron optical column of an electron probe beam instrument such that the at least one electron beam having phase dislocations is configured to be directed onto a specimen.

2. The system of claim 1, wherein the hologram is a forked grating hologram, and the phase dislocations are spiral phase dislocations.

3. The system of claim 1, wherein the diffractive hologram is permanently imprinted onto a condenser lens aperture for a scanning transmission electron microscope.

4. The system of claim 1, wherein the electron probe beam instrument is a scanning electron microscope, a scanning transmission electron microscope or a spectroscope.

5. The system of claim 1, wherein the nanoscale diffractive hologram is composed of silicon nitride, platinum, carbon thin film, diamond thin film or silicon.

6. The system of claim 1, wherein the hologram is placed between an electron source and the specimen in a scanning electron microscope.

7. The system of claim 1, wherein the hologram is placed in the condenser aperture of a scanning transmission electron microscope.

8. The system of claim 1, wherein the specimen is magnetic.

9. The system of claim 1, wherein the pattern of the diffractive hologram is configured to produce, when illuminated, a Hermite Gaussian electron beam with either vertically-oriented edge-type wavefront dislocations or horizontally-oriented edge-type wavefront dislocations.

10. The system of claim 1, wherein the pattern of the diffractive hologram is configured to produce, when illuminated, a Hermite Gaussian electron beam with both vertically-oriented and horizontally-oriented edge-type wavefront dislocations.

11. The system of claim 1, wherein the pattern of the diffractive hologram is configured to produce, when illuminated, an electron beam with superposed positive and negative orbital angular momentum states.

12. The system of claim 1, further comprising:
a detection device configured to detect one or more beam property-dependent signals generated when the at least one electron beam having phase dislocations is directed onto the specimen.

13. A system for producing and using multiple electron beams with quantized orbital angular momentum, the system comprising:
a nanoscale diffractive hologram having a pattern disposed therein; and
an electron probe beam instrument having an illumination element, the illumination element being configured to illuminate the diffractive hologram device with electrons, thus causing said electrons to diffract into at least one electron beam having phase dislocations based on the pattern of said diffractive hologram device, wherein the diffractive hologram device is placed in the electron optical column of the electron probe beam instrument such that the at least one electron beam having phase dislocations is configured to be directed onto a specimen.

14. The system of claim 13, wherein the hologram is a forked grating hologram, and the phase dislocations are spiral phase dislocations.

15. The system of claim 13, wherein the diffractive hologram is permanently imprinted onto a condenser lens; and the electron probe beam instrument is a scanning transmission electron microscope.

16. The system of claim 13, wherein the electron probe beam instrument is a scanning electron microscope, a scanning transmission electron microscope or a spectroscope.

17. The system of claim 13, wherein the nanoscale diffractive hologram is composed of silicon nitride, platinum, carbon thin film, diamond thin film or silicon.

18. The system of claim 13, wherein the hologram is placed between a first condenser lens and a second condenser lens of a scanning electron microscope.

19. The system of claim 13, wherein the specimen is composed of iron, cobalt or nickel.

20. The system of claim 13, wherein the pattern of the diffractive hologram is configured to produce, when illuminated, a Hermite Gaussian electron beam with either vertically-oriented edge-type wavefront dislocations or horizontally-oriented edge-type wavefront dislocations.

21. The system of claim 13, wherein the pattern of the diffractive hologram is configured to produce, when illuminated, a Hermite Gaussian electron beam with both vertically-oriented and horizontally-oriented edge-type wavefront dislocations.

22. The system of claim 13, wherein the pattern of the diffractive hologram is configured to produce, when illuminated, an electron beam with superposed positive and negative orbital angular momentum states.

23. The system of claim 13, further comprising:
a detection device configured to detect one or more beam property-dependent signals generated when the at least one electron beam having phase dislocations is directed onto the specimen.

24. A method for producing and using multiple electron beams with quantized orbital angular momentum, the method comprising:
providing a nanoscale diffractive hologram having a pattern disposed therein,
placing the nanoscale diffractive hologram into the electron optical column of an electron probe beam instrument;
illuminating the diffractive hologram device with electrons, thus causing said electrons to diffract into at least one electron beam having phase dislocations based on the pattern of said diffractive hologram device;
causing the at least one electron beam having phase dislocations to be directed onto a specimen.

25. The method of claim 24, wherein the electron probe beam instrument is a scanning transmission electron microscope.

26. The method of claim 24, wherein the hologram device is a forked grating hologram, and the phase dislocations are spiral phase dislocations.

27. The method of claim 24, wherein the nanoscale diffractive hologram is composed of silicon nitride, platinum, carbon thin film, diamond thin film or silicon.

28. The method of claim 24, wherein the specimen is composed of iron, cobalt or nickel.

* * * * *